United States Patent
Kirner et al.

(10) Patent No.: US 12,300,446 B2
(45) Date of Patent: May 13, 2025

(54) MULTIJUNCTION PHOTOVOLTAIC DEVICES WITH METAL OXYNITRIDE LAYER

(71) Applicant: OXFORD PHOTOVOLTAICS LIMITED, Yarnton (GB)

(72) Inventors: Simon Kirner, Yarnton (GB); Laura Miranda Perez, Yarnton (GB); Immo Koetschau, Yarnton (GB); Henry Snaith, Yarnton (GB); Edward Crossland, Yarnton (GB); Christopher Case, Yarnton (GB); Alan Sharp, Yarnton (GB)

(73) Assignee: Oxford Photovoltaics Limited, Yarnton (GB)

( * ) Notice: Subject to any disclaimer, the term of this patent is extended or adjusted under 35 U.S.C. 154(b) by 0 days.

(21) Appl. No.: 18/011,059

(22) PCT Filed: Jun. 17, 2021

(86) PCT No.: PCT/GB2021/051548
§ 371 (c)(1),
(2) Date: Dec. 16, 2022

(87) PCT Pub. No.: WO2021/255468
PCT Pub. Date: Dec. 23, 2021

(65) Prior Publication Data
US 2023/0223205 A1    Jul. 13, 2023

(30) Foreign Application Priority Data
Jun. 18, 2020 (EP) .................. 20180705

(51) Int. Cl.
*H01G 9/20* (2006.01)
*H01G 9/00* (2006.01)
(Continued)

(52) U.S. Cl.
CPC ......... *H01G 9/2027* (2013.01); *H01G 9/0029* (2013.01); *H01G 9/2031* (2013.01);
(Continued)

(58) Field of Classification Search
None
See application file for complete search history.

(56) References Cited

U.S. PATENT DOCUMENTS

| 2012/0097227 A1 | 4/2012 | Lim et al. | |
| 2013/0102133 A1* | 4/2013 | Sheng | C23C 16/5096 438/478 |

(Continued)

FOREIGN PATENT DOCUMENTS

| KR | 20120034966 A | * | 4/2010 |
| KR | 10-2012-0041942 A | | 5/2012 |

(Continued)

OTHER PUBLICATIONS

Machine translation of KR20120034966A (Year: 2012).*

(Continued)

*Primary Examiner* — Ryan S Cannon
(74) *Attorney, Agent, or Firm* — Meunier Carlin & Curfman LLC

(57) ABSTRACT

A multi-junction photovoltaic device comprising a layer of metal oxynitride between a first sub-cell and a second sub-cell is disclosed, the first sub-cell having a layer comprising a perovskite light absorber material. In addition, a method of manufacturing said multi junction photovoltaic device is disclosed. The metal oxynitride is preferably titanium oxynitride. Advantageously, the device may be produced in a simple, fast, consistent and inexpensive manner, whilst the properties of the titanium oxynitride layer may be tuned to avoid the occurrence of local shunt paths and to reduce reflection losses.

18 Claims, 11 Drawing Sheets

(51) Int. Cl.
  *H10K 39/15* (2023.01)
  *H10K 71/60* (2023.01)
(52) U.S. Cl.
  CPC ............. *H10K 39/15* (2023.02); *H10K 71/60* (2023.02); *H01G 9/2059* (2013.01)

(56) References Cited

U.S. PATENT DOCUMENTS

| | | | |
|---|---|---|---|
| 2013/0175674 A1* | 7/2013 | Hsieh | H01L 29/36 257/655 |
| 2014/0087513 A1* | 3/2014 | Chen | H01L 31/0747 438/96 |
| 2016/0190377 A1* | 6/2016 | Green | H10K 30/57 438/74 |
| 2018/0019358 A1* | 1/2018 | Ahn | H01L 31/022475 |
| 2018/0175112 A1 | 6/2018 | Robinson et al. | |
| 2018/0315870 A1 | 11/2018 | Snaith et al. | |
| 2020/0058819 A1 | 2/2020 | Kirner | |
| 2023/0144354 A1* | 5/2023 | Wu | H01L 31/078 136/255 |

FOREIGN PATENT DOCUMENTS

| | | | |
|---|---|---|---|
| KR | 10-2019-0129370 A | 11/2019 | |
| WO | 2013/171517 A1 | 11/2013 | |
| WO | 2014/045021 A1 | 3/2014 | |
| WO | 2016/198898 A1 | 12/2016 | |
| WO | WO-2019048839 A1 * | 3/2019 | ........... H01L 27/302 |

OTHER PUBLICATIONS

Reinders, Angèle, et al. Photovoltaic Solar Energy—from Fundamentals to Applications, edited by A Reinders et al., Wiley ISBN9781118927465 [2017] on p. 164.
Mazzarella, Luana, et al. "Infrared light management using a nanocrystalline silicon oxide interlayer in monolithic perovskite/silicon heterojunction tandem solar cells with efficiency above 25%." Advanced Energy Materials 9.14 (2019): 1803241.
Zuo, Chuantian, et al. "Advances in perovskite solar cells." Advanced Science 3.7 (2016): 1500324.
Sarkar, Swagato, et al. "Hybridized guided-mode resonances via colloidal plasmonic self-assembled grating." ACS applied materials & interfaces 11.14 (2019): 13752-13760.
Siefke, Thomas, et al. "Materials pushing the application limits of wire grid polarizers further into the deep ultraviolet spectral range." Advanced Optical Materials 4.11 (2016): 1780-1786.
Subrahmanyam, A., and A. Karuppasamy. "Optical and electrochromic properties of oxygen sputtered tungsten oxide (WO3) thin films." Solar energy materials and solar cells 91.4 (2007): 266-274.
Rao, M. C., and O. M. Hussain. "Optical properties of vacuum evaporated WO3 thin films." Res. J. Chem. Sci. 2231 (2011): 606X. pp. 76-80.
Stelling, Christian, et al. "Plasmonic nanomeshes: their ambivalent role as transparent electrodes in organic solar cells." Scientific reports 7.1 (2017): 42530.
Vos, Martijn FJ, et al. "Atomic layer deposition of molybdenum oxide from (N t Bu) 2 (NMe2) 2Mo and O2 plasma." Journal of Vacuum Science & Technology A: Vacuum, Surfaces, and Films 34.1 (2016): 01A103.
Al-Kuhaili, M. F. "Optical properties of hafnium oxide thin films and their application in energy-efficient windows." Optical Materials 27.3 (2004): 383-387.
Bright, Trevor J., et al. "Infrared optical properties of amorphous and nanocrystalline Ta2O5 thin films." Journal of Applied Physics 114.8 (2013): 083515.
Gao, Lihong, Fabien Lemarchand, and Michel Lequime. "Exploitation of multiple incidences spectrometric measurements for thin film reverse engineering." Optics express 20.14 (2012): 15734-15751.
Hojabri, Alireza. "Structural and optical characterization of ZrO2 thin films grown on silicon and quartz substrates." Journal of Theoretical and Applied Physics 10.3 (2016): 219-224.
Ivanova et al. "Surface characterization of chromium oxide thin films in dependence on CVD growth process parameters." ECS Transactions 2.7 (2007): 229-236.
Wan, Chenghao, et al. "On the optical properties of thin-film vanadium dioxide from the visible to the far infrared." Annalen der Physik 531.10 (2019): 1900188.
Schneider et alOptical properties and electronic structure of V2O5, V2O3 and VO2. Journal of Material Science: Materical in Electronics, vol. 31, 10478-10588 (2020).
Chen, Feiliang, et al. "Control of optical properties of TiN x O y films and application for high performance solar selective absorbing coatings." Optical Materials Express 4.9 (2014): 1833-1847.
Al-Ashouri, Amran, et al. "Monolithic perovskite/silicon tandem solar cell with> 29% efficiency by enhanced hole extraction." Science 370.6522 (2020): 1300-1309.
International Search Report and Written Opinion received in PCT/GB2021/051548 mailed Sep. 22, 2021.
International Preliminary Report on Patentability received in PCT/GB2021/051548 mailed Dec. 13, 2022, 7 pages.
Kojima, Akihiro, et al. "Organometal halide perovskites as visible-light sensitizers for photovoltaic cells." Journal of the american chemical society 131.17 (2009): 6050-6051.
European Search Report issued for Application No. 20180705.4, dated Nov. 16, 2020.
Office action issued for Korean Application No. KR10-2023-7001398, dated Mar. 8, 2025.

* cited by examiner

MULTIJUNCTION PHOTOVOLTAIC DEVICES WITH METAL OXYNITRIDE LAYER

CROSS REFERENCE TO RELATED APPLICATIONS

This application is a United States National Phase Patent Application of International Patent Application Number PCT/GB2021/051548 filed Jun. 17, 2021, which claims the benefit of priority to European Application No. 20180705.4 filed Jun. 18, 2020.

FIELD OF INVENTION

The present invention relates to photovoltaic (PV) devices, and particularly to multi-junction photovoltaic devices, such as tandem solar cells and PV panels, and to methods of their manufacture.

BACKGROUND OF THE INVENTION

Solar energy conversion is one of the most promising technologies to provide renewable energy. However, reducing the costs of manufacturing devices that effectively capture solar energy, particularly the costs of materials and necessary equipment, still remains crucial to promote their widespread use.

Single junction solar cells—such as those made from silicon p-n junctions for example—have a maximum theoretical efficiency of about 29% and practical efficiencies of up to 26% under AM1.5G conditions (see for example the book "Photovoltaic Solar Energy—from Fundamentals to Applications", edited by A Reinders et al., Wley ISBN9781118927465 [2017] on p. 164). However, if a cell of a material having a higher band gap is stacked on top of the silicon single junction cell (or other type of single junction cell) and connected in series, the limiting theoretical efficiency increases to above 40%. Therefore, tandem and other multi-junction cell technologies are currently met with growing interest.

A particularly promising class of monolithic tandem or multi-junction photovoltaic device solar cells combines sub-cells comprising perovskites (such as organometal halide perovskites), with a second sub-cell, which may comprise a photoactive silicon absorber, for example. Perovskites are known in the art to be ideal light absorbers in PV devices as they show a favourable band gap, a high absorption coefficient and long diffusion lengths.

Conventional perovskite/silicon tandem solar cells incorporate transparent conductive oxide (TCO) layers (comprising on top of the silicon bottom sub-cell) that are necessary to form a low ohmic tunnel recombination contact between the silicon sub-cell and the perovskite sub-cell. Typical examples of TCO materials include indium-tin oxide (ITO), or aluminum, gallium or indium-doped zinc oxide (AZO, GZO or IZO), for example, of which ITO is most commonly used.

However, the use of interconnect layers comprising ITO may be disadvantageous for multiple reasons. Firstly, ITO layers tend to form highly reflective interfaces, because of the unfavourable order of refractive indices. Moreover, they exhibit a high lateral conductivity, which may lead to the presence of shunt paths through the perovskite absorbers in the completed device.

To reduce the reflection between the perovskite top cell and the silicon bottom cell, the use of a sub-stoichiometric nanocrystalline silicon oxide (nc-$SiO_x$) layer, located on top of an amorphous silicon i-layer and below an ITO layer, which forms the contact to the p-layer of the top cell, is proposed by L. Mazzarella et al., Advanced Energy Materials 2019, 9(14), 1803241.

WO 2018/150203 A1 further discloses that incorporating an intermediate region comprising an interconnect layer with a two-phase material comprising elongate silicon nanocrystals embedded in a silicon oxide matrix between a perovskite-based sub-cell and a photoactive silicon-based sub-cell may reduce the detrimental influence of local shunt paths and may be tuned to reduce reflection losses.

However, the process used in WO 2018/150203 A1 for the deposition of the two-phase material is a special kind of plasma enhanced chemical vapor deposition (PECVD), which relies on the interplay of several surface chemical mechanisms like preferential etching, large surface diffusion and chemical annealing to achieve a structure with the desired transversal and longitudinal conductivity, which accordingly all leads to small deposition rates of around 0.2 nm/s. Additionally, the relatively high chamber pressures combined with the high gas dissociation rate in this particular regime can lead to plasma polymerization during the process, which negatively affects process stability and repeatability. Overall, the PECVD process also requires expensive and elaborate equipment.

In view of the above, it remains desirable to provide multi-junction photovoltaic devices, wherein the aforementioned disadvantages of known interconnect layers are overcome, and which may be simultaneously produced in a simpler, faster, consistent and less expensive manner.

SUMMARY OF THE INVENTION

The present invention mitigates these disadvantages with the subject matter of the claims as defined herein. Further advantages of the present invention will be further explained in detail in the section below.

According to a first aspect, the present invention relates to a multi-junction photovoltaic device comprising a first sub-cell and a second sub-cell, the first sub-cell having a layer comprising a perovskite light absorber material, characterized in that a layer of metal oxynitride ($M_nO_xN_y$) is provided between the first sub-cell and the second sub-cell. Unlike nanocrystalline silicon oxide, metal oxynitrides such as titanium oxynitride can be deposited by physical vapor deposition (such as sputtering methods, for example) at a higher deposition rate, the refractive index of the resulting layer may be easily tuned to the desired refractive index enabling mitigation of reflectivity losses, which substantially improves the layer absorbance of the bottom sub-cell. Simultaneously, the metal (e.g. titanium) oxynitride layer is transparent to infrared light and exhibits excellent conductivity characteristics for efficient electrical interconnection of the two-sub-cells.

A second aspect of the present invention relates to a method of manufacturing a multi-junction photovoltaic device comprising a first sub-cell having a layer comprising a perovskite light absorber material and a second sub-cell, the method comprising the step of depositing a layer of metal oxynitride between the first sub-cell and the second sub-cell.

Preferred embodiments of the multi-junction photovoltaic device according to the present invention, its manufacturing method and other aspects of the present invention are described in the following description and the claims.

BRIEF DESCRIPTION OF THE DRAWINGS

Embodiments of the invention will now be described, by way of example only, with reference to the accompanying schematic drawings, in which.

DETAILED DESCRIPTION OF THE INVENTION

For a more complete understanding of the present invention, reference is now made to the following description of the illustrative embodiments thereof:
Multi-Junction Photovoltaic Device In a first embodiment, the present invention relates to a multi-junction photovoltaic device comprising a first sub-cell and a second sub-cell, the first sub-cell having a layer comprising a perovskite light absorber material, characterized in that a layer of metal (e.g. titanium) oxynitride is provided between the first sub-cell and the second sub-cell.

By "multi-junction", is meant two or more. Preferably, the second sub-cell is a silicon sub-cell. Advantageously, the photovoltaic device has a monolithically integrated structure, for example a tandem structure, comprising the first sub-cell and the second sub-cell. In a monolithically integrated multi-junction photovoltaic device the two or more photovoltaic sub-cells are deposited directly onto one another and are therefore electrically connected in series. The photovoltaic device may optionally further comprise an intermediate region connecting the first sub-cell to the second sub-cell, wherein each intermediate region comprises one or more electrically conductive interconnect layers.

Figure 1:
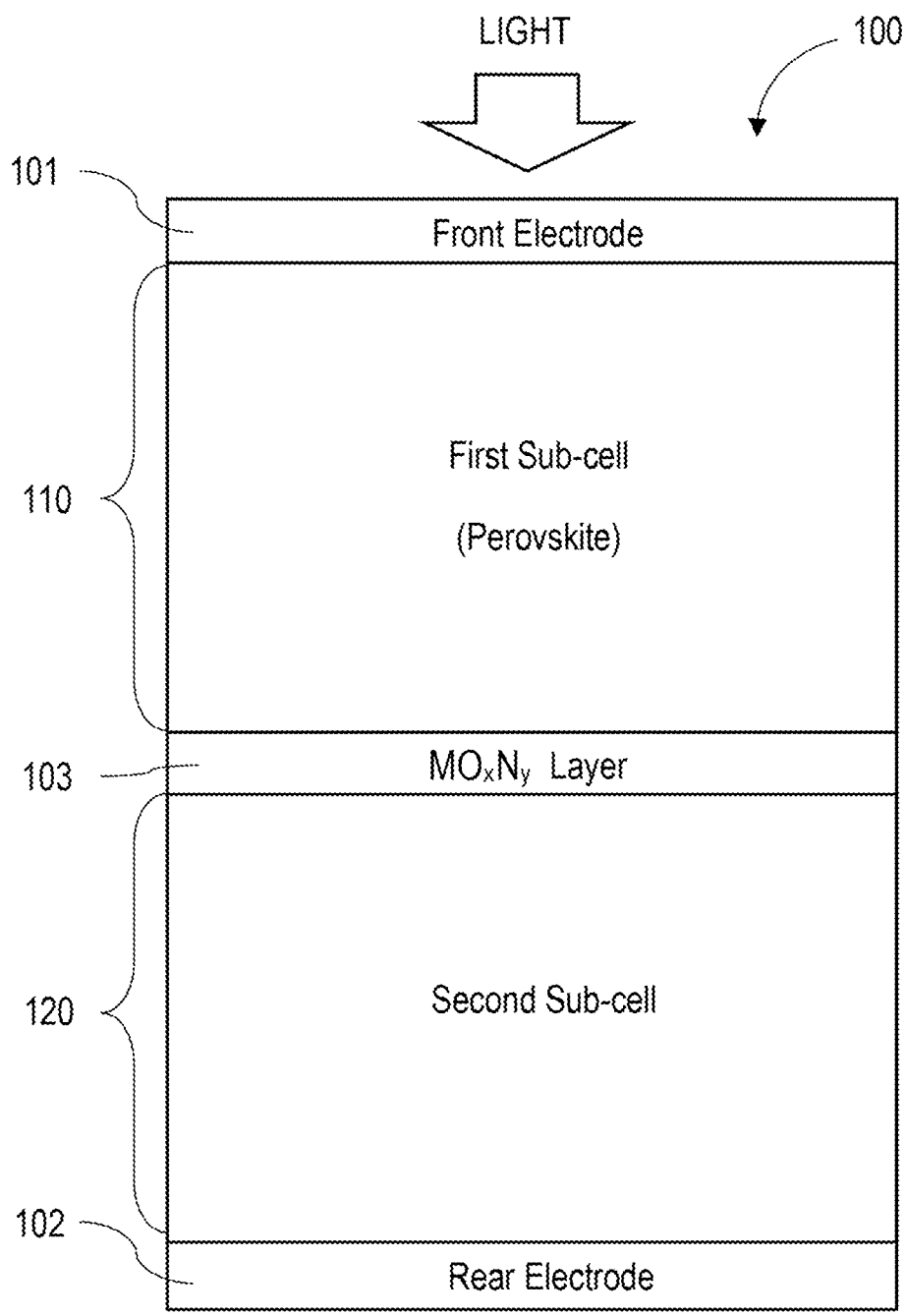
FIG. 1 illustrates schematically an example of a monolithically integrated multi-junction photovoltaic device according to the present invention.

An exemplary general structure of a photovoltaic device according to the present invention is illustrated in FIG. 1. The illustrated monolithic multi-junction photovoltaic device (100) comprises, between a front electrode (101) and a rear electrode (102), a top perovskite based sub-cell as a first sub-cell (110) and a second sub-cell (120) at the bottom, with a metal (e.g. titanium) oxynitride layer (103) provided between the first sub-cell (110) and the second sub-cell (120). This layer is denoted by formula $MO_xN_y$ in the figure but this can equally be denoted by $MnO_xN_y$. It will be understood that additional layers may be provided between the first and second sub cells.

The term "front electrode", as used herein, refers to the electrode provided on that side or surface of a photovoltaic device that it is intended will be exposed to sun light. The front electrode is therefore typically required to be transparent or semi-transparent so as to allow light to pass through the electrode to the photoactive layers provided beneath the front electrode. The term "rear electrode", as used herein, therefore refers to the electrode provided on that side or surface of a photovoltaic device that is opposite to the side or surface that it is intended will be exposed to sun light. The choice of the front and rear electrodes of the optoelectronic devices of the present invention may be suitably selected by the skilled artisan from materials known in the art and may depend on the structure type. Exemplary materials include, but are not limited to metals and metal oxides, such as e.g. tin oxide, ITO (indium tin oxide), FTO (fluorine-doped tin oxide) or AZO (aluminium-doped tin oxide), and high work function metals, such as aluminium, gold, silver, nickel, palladium or platinum. The thicknesses of the front and rear electrodes may be suitably selected by the skilled artisan and typically range from 50 nm to 600 nm, more typically from 300 to 500 nm. For instance, the thickness may be 400 nm. The first electrode will often be disposed on a glass substrate.

The term "perovskite", as used herein, refers to a material with a structure related to that of $CaTiO_3$. The structure of $CaTiO_3$ can be represented by the formula $ABX_3$, wherein A and B represent cations of different sizes and X is an anion. In a unit cell, the A cations are at (0, 0, 0), the B cations are at (½, ½, ½) and the X anions are at (½, ½, 0). The A cation is usually larger than the B cation. The skilled person will appreciate that A, B and X may be varied so as to cause the structure of the perovskite material to distort away from the structure adopted by $CaTiO_3$ to a lower-symmetry distorted structure. The symmetry will also be lower if the material comprises a layer that has a structure related to that of $CaTiO_3$. The skilled person will appreciate that a perovskite material can be represented by the formula $[A][B][X]_3$, wherein [A] is at least one cation, [B] is at least one cation and [X] is at least one anion. When the perovskite comprises more than is one A cation, the different A cations may be distributed over the A sites in an ordered or disordered way.

When the perovskite comprises more than one B cation, the different B cations may be distributed over the B sites in an ordered or disordered way. When the perovskite comprises more than one X anion, the different X anions may be distributed over the X sites in an ordered or disordered way. The symmetry of a perovskite comprising more than one A cation, more than one B cation or more than one X cation, will often be lower than that of $CaTiO_3$.

In general, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it may be preferable to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D-layered structure may comprise layers of perovskite unit cells that are separated by (intercalated) molecules; an example of such a 2D-layered perovskite is [2-(1-cyclohexenyl)ethylammonium]$_2$PbBr$_4$. 2D-layered perovskites tend to have high exciton binding energies, which favours the generation of bound electron-hole pairs (excitons), rather than free charge carriers, under photoexcitation. The bound electron/hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite which has a three-dimensional crystal structure.

In preferred embodiments, the perovskite material is of general formula [A][B][X]$_3$, wherein [A] is one or more monovalent cations, [B] is one or more divalent inorganic cations, and [X] is one or more halide anions preferably selected from fluoride, chloride, bromide, and iodide, and further preferably selected from chloride, bromide and iodide. More preferably, [X] comprises one or more halide anions selected from bromide and iodide. [A] preferably comprises one or more organic cations selected from methylammonium ($CH_3NH_3^+$), formamidinium ($HC(NH_2)_2^+$), and ethyl ammonium ($CH_3CH_2NH_3^+$), and preferably comprises one organic cation selected from methylammonium ($CH_3NH_3^+$ and formamidinium ($HC(NH_2)_2^+$). [A] may comprise one or more inorganic cations selected from $Cs^+$, $Rb^+$, $Cu^+$, $Pd^+$, $Pt^+$, $Ag^+$, $Au^+$, $Rh^+$, and $Ru^+$. [B] preferably comprises at least one divalent inorganic cation selected from $Pb^{2+}$ and $Sn^{2+}$, and preferably comprises $Pb^{2+}$. Further examples of preferred perovskite materials are disclosed in Kojima, A. et al., Journal of the American Chemical Society 2009, 131(17), pp. 6050-1; Zuo, C. et al., Adv. Sci. 2016, 3, 1500324; WO 2013/171517 A1; WO 2014/045021 A1; WO 2016/198898 A1 and WO 2018/150203 A1, for example.

The term "perovskite light absorber material" as used herein, denotes a perovskite material which is capable of absorbing light and thereby generating free charge carriers. However, the perovskite material can be a perovskite material which may also be capable of emitting light, by accepting charge, both electrons and holes, which subsequently recombine and emit light.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material. Typically, the perovskite semiconductor used in the present invention is a photosensitizing material, i.e. a material which is capable of performing both photo-generation and charge transport.

The term "metal oxynitride" used herein denotes a material having the formula $MnO_xN_y$. x and y, as well as the concentration ratio x/y (expressed as a ratio between the concentration of oxygen x and the concentration of nitrogen y in atomic percent, also referred to as O/N ratio), may be suitably adjusted to balance the desired electrical conductivity and the optical transmittance and reflectivity of the metal oxynitride layer, depending on the deposited thickness of the layer. The metal, M, is preferably an early transition metal, for instance a metal from Groups 4-6 of the Periodic Table. Early transition oxynitride metals ($M_nO_xN_y$) are known to form non-stoichiometric, interstitial compounds with large free-carrier concentrations. The formula for the metal oxynitride is preferably $M_nO_xN_y$ wherein n is 1 or 2. The advantage of the metal nitrides vs their oxide counterparts include simple fabrication methods (they can all be deposited by sputtering) and the introduction of N allows for optimization of the refractive index (RI). These points make these materials very desirable for interlayer applications in multijunction photovoltaic devices. A system that can allow for a fine tuning is an advantage to achieve the highest efficiencies.

Preferred metals for the metal oxynitride are Ti, W, Mo, Hf, Ta, Nb, Zr, Cr and V, which form the following oxynitrides: $Ti_nO_xN_y$, $W_nO_xN_y$, $Mo_nO_xN_y$, $Hf_nO_xN_y$, $Ta_nO_xN_y$, $Nb_nO_xN_y$, $Zr_nO_xN_y$, $Cr_nO_xN_y$, $V_nO_xN_y$. The RIs of the corresponding metal oxides for these oxynitrides is shown in the table below. The use of N can then fine tune the RI further so that it is appropriate for use in the invention. The oxides given in the table are exemplary only and the invention is not limited to these.

TABLE 1

Table 1: The RI ranges listed in the table above are either provided to cover differing values across the references (see $TiO_2$, $WO_3$, $MoO_3$) or because they have been approximated by extraction from a figure within a reference.

| $M_nO_x$ | RI | Λ (nm) | Reference |
|---|---|---|---|
| $TiO_2$ | 2.10-2.34 | 800 | Sarkar et al. "Hybridized guided-mode resonances via colloidal plasmonic self-assembled grating", ACS Appl. Mater. Interfaces, 11, 13752-13760 (2019) and Siefke et al. T. "Materials pushing the application limits of wire grid polarizers further into the deep ultraviolet spectral range", Adv. Opt. Mater. 4, 1780-1786 (2016) |
| $WO_3$ | 1.98-2.10 | 800 | Subrahmanyam et al. "Optical and electrochromic properties of oxygen sputtered tungsten oxide (WO3) thin films", Solar Energy Materials and Solar cells, Vol. 91, 4, 266-274, (2007) and M.C. et al. "Optical Properties of Vacuum Evaporated WO3 Thin films", Research Journal of Chemical Sciences, Vol. 1, 76-80, (2011) |
| $MoO_3$ | 1.79-2.05 | 800 | Stelling et al. "Plasmonic nanomeshes: their ambivalent role as transparent electrodes in organic solar cells", Sci. Rep. 7, 42530 (2017) and Vos et al. "Atomic layer deposition of molybdenum oxide from (NtBu)2(NMe2)2Mo and O2 plasma", J. Vac. Scia. Technol. A 34, 01A103, (2016) |
| $HfO_2$ | 1.89 | 800 | Al-Kuhaili et al. "Optical properties of hafnium oxide thin films and their application in energy-efficient windows". Opt. Mat. 27, 383-387 (2004) |
| $Ta_2O_5$ | 2.10-2.16 | 800 | Bright et al. "Infrared optical properties of amorphous and nanocrystalline Ta2O5 thin films", J. Appl. Phys 114, 083515 (2013)and |
| $Nb_2O_5$ | 2.28 | 800 | Lemarchand et al. "Exploitation of multiple incidences spectrometric measurements for thin film reverse engineering", Opt. Express 20, 15734-15751 (2012) |
| $ZrO_2$ | 2-2.20 | 800 | Hojabri et al. "Structural and optical characterization of ZrO2 thin films grown on silicon and quartz substrates" Journal of Theoretical and Applied Physics, 10, 219-224 (2016) |
| $Cr_2O_3$ | 1.90-2.00 | 800 | Ivanova et al. "Surface Characterization of Chromium Oxide Thin Films in Dependence on CVD Growth Process Parameters" ECS Transactions, 2 (7), 229-236 (2007) |
| $VO_2$ | 2.30-2.60 | 800 | Wan et al. "On the Optical Properties of Thin-Film Vanadium Dioxide from the Visible to the Far Infrared", Annalen der Physik, V. 531, 10, (2019) |
| $V_2O_5$ | 2.35-2.45 | 800 | Schneider et al. "Optical properties and electronic structure of V2O5, V2O3 and VO2", Journal of Materials Science: Materials in Electronics, Vol. 31, 10478-10588 (2020) |

The range for the metal oxides as shown in the table above is around 1.8-2.5. These are further tuneable with the amount of Nitrogen content so that they are appropriate for use in the invention, where the preferred refractive index for the metal oxynitride is between 2.39-2.9.

The most preferred metal is titanium. The term "titanium oxynitride" as used herein, denotes a material having the formula $TiO_xN_y$. x and y, as well as the concentration ratio x/y (expressed as a ratio between the concentration of nitrogen x and the concentration of oxygen y in atomic percent, also referred to as O/N ratio), may be suitably adjusted to balance the desired electrical conductivity and the optical transmittance and reflectivity of the titanium oxynitride layer, depending on the deposited thickness of the layer. From this standpoint, it is preferred that x is in the range of from 0.60 to 0.95, and y is in the range of from 0.10 to 1.2. In addition or alternatively, a ratio x/y in the range of 0.4 to 5 may be preferable, and a ratio x/y in the range of from 0.6 to 4.5 is particularly preferred. As will be explained in conjunction with the second embodiment below, the O/N ratio and the properties of the $TiO_xN_y$ films may be controlled in a straightforward manner by suitably adjusting the deposition conditions. As has been mentioned above, the deposition of the titanium oxynitride layer may be performed by physical vapor deposition (PVD) methods (such as sputtering, for example) and thus requires less elaborate equipment and allows deposition at a higher rate when compared to PECVD methods used for the preparation of known interconnect layers.

It is generally preferred that the layer of metal (e.g. titanium) oxynitride is adapted to have a refractive index n between that of the perovskite material layer and the material on which the second sub-cell is based. Furthermore, if additional intermediate layers are employed between the first and the second sub-cell, it is preferable that the refractive indices of each layer are adapted to increase in the direction of the light path in order to minimize reflectivity losses. In preferred embodiments, the layer of titanium oxynitride is adapted to have a refractive index n in the range of from 2.3 to 3.7, further preferably in the range of from 2.3 and 3.2, especially preferably between 2.3 and 2.9, such as from 2.4 to 2.8, the given values being typically measured with respect to light having a wavelength of 600 nm. In preferred embodiments, the layer of titanium oxynitride has a thickness of between 15 nm and 300 nm, further preferably between 20 nm and 200 nm, and especially preferably between 40 nm and 160 nm. By adjusting the optical thickness of the titanium oxynitride layer and the refractive index according to the above ranges, the reflectivity may be effectively reduced.

In preferred embodiments of the present invention, the first sub-cell also comprises an n-type semiconducting layer on one surface of the layer comprising a perovskite light absorber material and a p-type semiconducting layer on the other surface of the layer comprising a perovskite light absorber material (i.e. the surface opposed to the n-type semiconducting layer).

The term "n-type", as used herein, refers to a region, layer or material that comprises an extrinsic semiconductor with a larger concentration of electrons than holes. Similarly, the term "n-type semiconducting layer" refers to a layer of an electron-transporting (i.e. an n-type) semiconductive material. Said material can be a single electron-transporting semiconductive compound or elemental material, or a mixture of two or more electron-transporting semiconductive compounds or elemental materials. An electron-transporting semiconductive compound or elemental material may be undoped or doped with one or more dopant elements. While not being limited thereto, examples of n-type semiconductive materials include inorganic materials selected from oxide of titanium, tin, zinc, niobium, tantalum, tungsten, indium, gallium, neodymium, palladium, cadmium, or an oxide of a mixture of two or more of said metals; a sulfide of cadmium, tin, copper, zinc or a sulfide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals, for example. Further examples include organic and polymeric electron-transporting materials, and electrolytes, such as a fullerene or a fullerene derivative, an organic electron transporting material comprising perylene or a derivative thereof, or poly {[N,N0-bis(2-octyldodecyl)-naphthalene-1,4,5,8-bis (dicarboximide)-2,6-diyl]-alt-5,50-(2,20-bithiophene)} (P(NDI2OD-T2)), for example.

The term "p-type", as used herein, refers to a region, layer or material that comprises an extrinsic semiconductor with a larger concentration of holes than electrons. The term "p-type semiconducting layer" refers to a layer of a hole-transporting (i.e. a p-type) semiconductive material. A hole-transporting (i.e. a p-type) semiconductive material can be a single hole-transporting semiconductive compound or elemental material, or a mixture of two or more hole-transporting semiconductive compounds or elemental materials. A hole-transporting semiconductive compound or elemental material may be undoped or doped with one or more dopant elements. The p-type layer employed in the optoelectronic device of the invention may comprise an inorganic or an organic p-type material. While not being limited thereto, examples of p-type semiconductive materials include polymeric or molecular hole transporters (e.g. spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]], PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine); molecular hole transporting compounds, polymeric hole transporting compounds and copolymer hole transporting compounds (e.g. a polymer or copolymer comprising one or more of the following moieties: thiophenyl, phenelenyl, dithiazolyl, benzothiazolyl, di ketopyrrolopyrrolyl, ethoxydithiophenyl, amino, triphenyl amino, carbozolyl, ethylene dioxythiophenyl, dioxythiophenyl, or fluorenyl); m-MTDATA (4,4',4"-tris(methylphenylphenylamino)triphenylamine), MeOTPD (N, N, N',N'-tetrakis(4-methoxyphenyl)-benzidine); BP2T (5,5'-di(biphenyl-4-yl)-2,2'-bithiophene); Di-NPB (N,N'-Di-[(1-naphthyl)-N,N'-diphenyl]-1,1'-biphenyl)-4,4'-diamine); α-NPB (N,N'-di(naphthalen-1-yl)-N, N'-diphenyl-benzidine); TNATA (4,4',4"-tris-(N-(naphthylen-2-yl)-N-phenylamine)triphenylamine); BPAPF (9,9-bis[4-(N,N-bis-biphenyl-4-yl-amino)phenyl]-9H-fluorene); spiro-NPB (N2,N7-Di-1-naphthalenyl-N2,N7-diphenyl-9,9'-spirobi[9H-fluorene]-2,7-diamine); 4P-TPD (4,4'-bis-(N,N-diphenylamino)-tetraphenyl); PEDOT:PSS; spiro-OMeTAD; inorganic hole transporting compounds (e.g., oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor). Both inorganic and organic p-type semiconductive materials may be undoped or doped with dopants known in the art.

The first photovoltaic sub-cell may have a regular structure, wherein the first sub-cell comprising the perovskite light absorber material is arranged such that the n-type region is adjacent to the second sub-cell. The photovoltaic device is then preferably configured so as to be illuminated through a p-type region of the first sub-cell.

Alternatively, the first photovoltaic sub-cell may have an inverted structure, wherein the first sub-cell comprising the perovskite light absorber material is arranged such that the p-type region is adjacent to the second sub-cell. The photovoltaic device is then preferably configured so as to be illuminated through an n-type region of the first sub-cell.

In such configurations, it may be further preferred that the layer of metal (e.g. titanium) oxynitride is adjacent and in contact with the semiconducting layer closer to the second sub-cell, i.e. the p-type semiconducting layer when the configuration of the multi-junction device is regular or the n-type semiconducting layer when the configuration of the multi-junction device is inverted.

In another preferred configuration, one of the n-type or p-type semiconducting layers of the first sub-cell is adjacent and in contact with a major surface of a layer of a light transmissive electrically conductive oxide layer, and the opposing major surface of the layer of a light transmissive electrically conductive oxide layer is adjacent and in contact with the layer of titanium oxynitride. In such a configuration, the light transmissive electrically conductive oxide layer may favourably serve to protect the titanium oxynitride layer during deposition of the first sub-cell. The materials used for the light transmissive conductive oxide layer may be selected from transparent and semi-transparent conductive oxides (TCO) known in the art. Typically, a transparent material will have an average transmission for light of around 100%, or from 90 to 100%, while a semi-transparent material will typically have an average transmission for light of from 10 to 90%, typically 40 to 60%. As examples thereof, ITO (indium tin oxide), FTO (fluorine-doped tin oxide) or AZO (aluminum-doped tin oxide) may be mentioned. The light transmissive electrically conductive oxide layer preferably has a thickness from 1 nm to 25 nm, preferably from 5 nm to 22 nm, and more preferably from 10 nm to 20 nm. However, it is noted that the light transmissive electrically conductive oxide layer is not essentially required and may be omitted, which may further simplify the manufacturing method and reduce costs. In this context, it may be preferred that no layer of a transparent conductive oxide is provided in addition to the metal (e.g. titanium) oxynitride layer between the first sub-cell and the second sub-cell layer.

In preferred embodiments, the second sub-cell is a silicon sub-cell. It preferably comprises a layer of crystalline silicon light absorber material. More preferably, the second sub-cell comprises a silicon heterojunction (SHJ). Alternatively, the second sub-cell may comprise other forms of silicon based sub-cells (including a diffused silicon junction, for example).

The term "silicon heterojunction" refers to an amorphous silicon/crystalline silicon heterojunction that makes use of a crystalline silicon (c-Si) wafer as a photoactive absorber and amorphous silicon (a-Si) thin-films for junction formation and surface passivation. In preferred embodiments, the second sub-cell therefore comprises a layer of crystalline silicon sandwiched between two layers of undoped amorphous silicon.

A silicon heterojunction (SHJ) is sometimes also referred to as a heterojunction with intrinsic thin layer (HIT) when any thin layers of intrinsic amorphous silicon (a-Si) are present as passivation/buffer layers. A silicon heterojunction (SHJ) therefore typically comprises a p-type a-Si emitter, an intrinsic a-Si passivation/buffer layer, an n-type c-Si photoactive absorber, another intrinsic a-Si passivation/buffer layer, and a back- or front-surface field (BSF or FSF) layer made of n-type a-Si. Optionally, a silicon heterojunction (SHJ) can further comprise a layer of a transparent conducting oxide (TCO) (e.g. ITO) between the back-surface field (BSF) layer and the rear electrode, which may promote maximization of the infrared response by increasing the internal reflectance at the rear surface. SHJ cells can be illuminated both through the p- or the n-side. In the latter case, it may be called a back-junction solar cell. Thus, a SHJ cell can be combined with a regular or inverted perovskite cell to form a tandem cell.

In preferred embodiments, an interconnect layer comprising doped nanocrystalline silicon (i.e. an nc-Si:H layer) may be provided between the layer of undoped amorphous silicon and the layer of metal (e.g. titanium) oxynitride.

A preferred configuration of a multi-junction photovoltaic device according to the present invention comprises, in the following order:
a) a front electrode;
b) the first sub-cell having a layer comprising a perovskite light absorber and comprising a sub-cell comprising an n-type semiconducting layer on one surface of the layer comprising a perovskite light absorber and a p-type semiconducting layer on the other surface of the layer comprising a perovskite light absorber;
c) an optional light transmissive electrically conductive oxide layer;
d) the layer of metal oxynitride;
e) an optional doped amorphous silicon layer;
f) the second sub-cell, comprising a layer of crystalline silicon light absorber material between a first and a second undoped amorphous silicon layer; and
g) a rear electrode.

Figure 2:
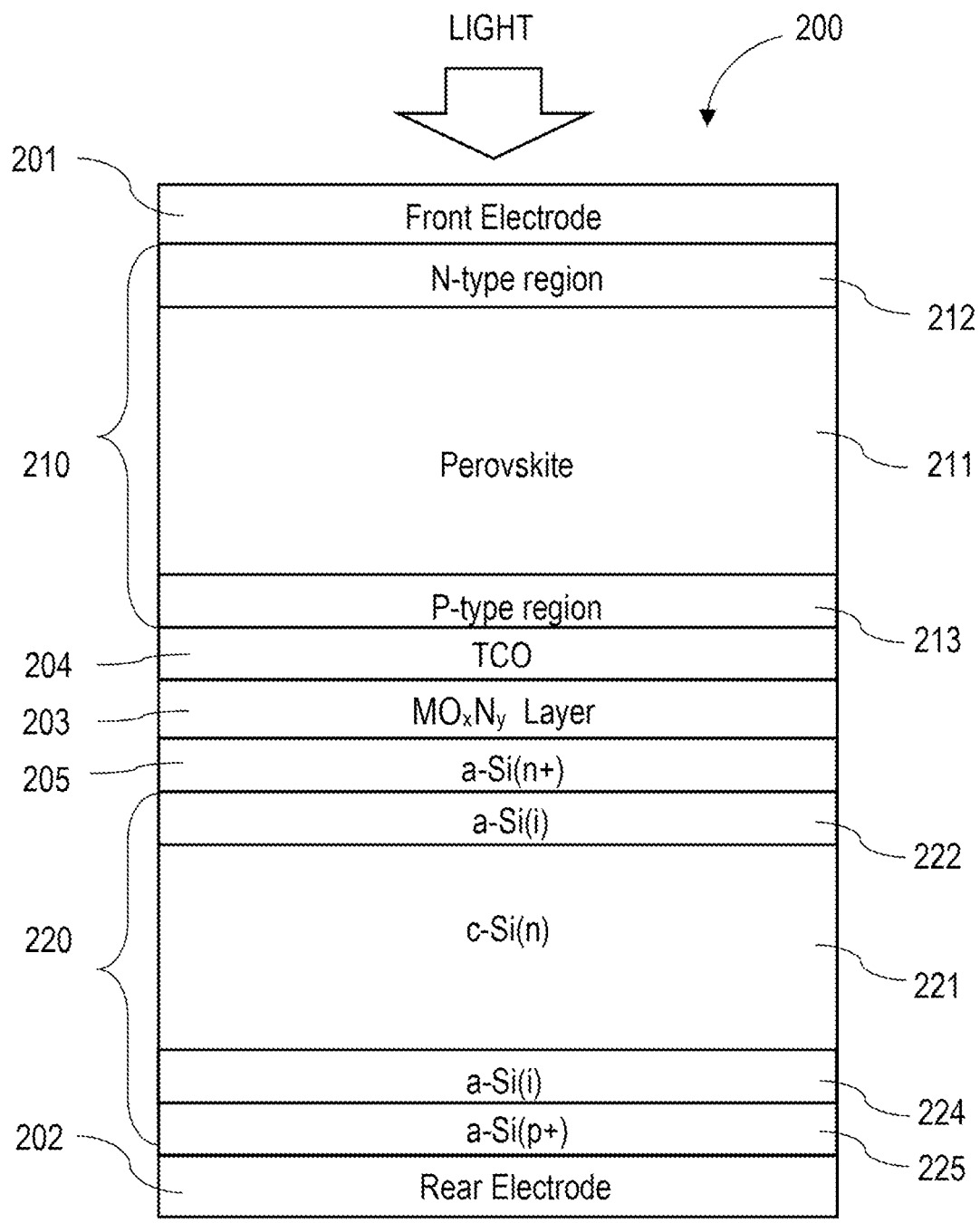
FIG. 2 illustrates a specific example of a monolithically integrated multi-junction photovoltaic device according to the present invention with an inverted structure.
Figure 3:
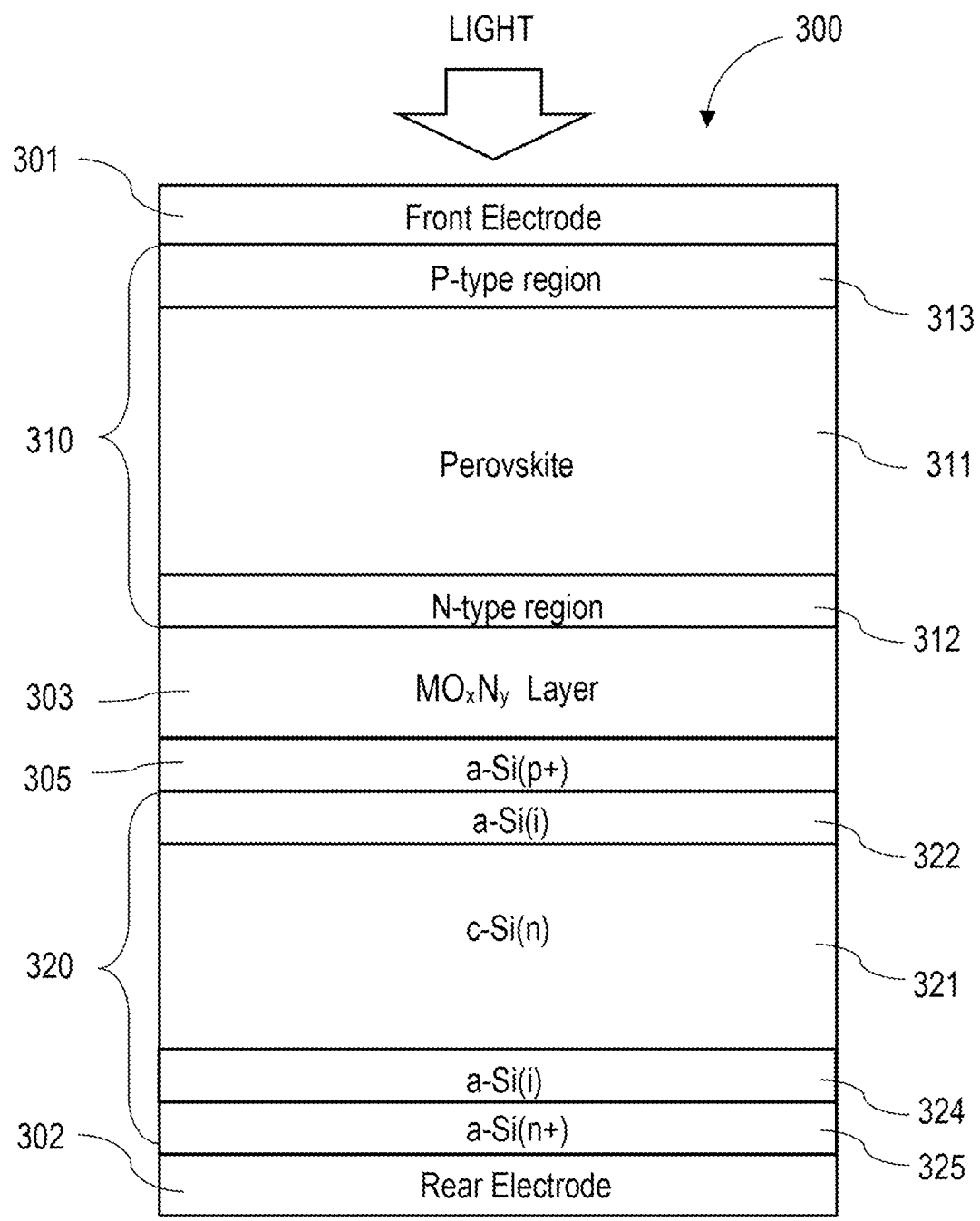
FIG. 3 illustrates another specific example of a monolithically integrated multi-junction photovoltaic device according to the present invention with a regular structure.

Specific examples of preferred device configurations using such silicon heterojunctions in the second sub-cells (i.e. bottom cells) are illustrated in FIGS. 2 and 3.

FIG. 2 schematically depicts a monolithically integrated multi-junction photovoltaic device 200 that comprises a first/top sub-cell 210 comprising a photoactive region that comprises a perovskite material, while the second/bottom sub-cell 220 comprises a photoactive silicon absorber. The multi-junction photovoltaic device 200 has a monolithically integrated structure and therefore comprises just two electrodes, a front electrode 201 and a rear electrode 202, with the first sub-cell 210 and the second sub-cell 220 disposed between these two electrodes. In particular, the first sub-cell 210 is in contact with the front electrode 201 and the second sub-cell 220 is in contact with the rear electrode 202. The monolithically integrated multi-junction photovoltaic device may typically also comprise a metal grid on the top surface of the front electrode 201 as a top contact (not shown). For instance, on the top contact could be provided a metal grid or fingers produced by screen printing of a silver and/or copper paste. In the example of FIG. 2, the first sub-cell 210 has an inverted structure. Specifically, the first sub-cell 210 is arranged such that the p-type semiconducting layer 213 is adjacent to the second sub-cell 220. The photovoltaic device 200 is then configured so as to be illuminated through an n-type semiconducting layer 212 of the first sub-cell 210. The photoactive region formed by the perovskite layer 211 is disposed between the p-type semiconducting layer 213 and the n-type semiconducting layer 212. The second sub-cell (bottom cell) 220 in FIG. 2 comprises a silicon heterojunction (SHJ) with a crystalline silicon layer 221, in this case an n-type c-Si photoactive absorber, which is sandwiched between a first undoped amorphous silicon layer 222 and a second undoped amorphous silicon layer 224, which serve as intrinsic a-Si (i.e. a-Si(i)) passivation/buffer layers. Below the second undoped amorphous silicon layer 224, a p-type amorphous silicon (a-Si) layer 225 is formed adjacent to the rear electrode 202. Between the first and the second sub-cells 210 and 220, a titanium oxynitride layer 203 is essentially provided. As is further shown in the preferred embodiment of FIG. 2, a doped amorphous silicon layer 205 (i.e. n-doped) is provided between the second sub-cell 220 and the titanium oxynitride layer 203, which serves to prevent sputter damage to the first undoped amorphous silicon layer 222 (i.e. the a-Si(i) layer) and provides for a good electron selective contact to the second sub-cell 220. Furthermore, the structure of FIG. 2 comprises a light transmissive electrically conductive oxide (TCO) layer 204, which may be formed of ITO or the like, between the p-type region of the first sub-cell 210 and the titanium oxynitride layer 203. The TCO layer 204 may protect the stack from oxidation before deposition of the n-type region of the first sub-cell 210. It is understood, however, that the presence of the light transmissive electrically conductive oxide layer 204 and the doped amorphous silicon layer 205 is optional.

As has been stated above, the multi-junction devices according to the present invention may encompass both regular and inverted configurations. One example of a regular structure is shown in FIG. 3. The multi-junction photovoltaic device 300 illustrated therein comprises a front electrode 301 and a rear electrode 302, with the first sub-cell 310 and the second sub-cell 320 disposed between these two electrodes. In particular, the first sub-cell 310 is in contact with the front electrode 301 and the second sub-cell 320 is in contact with the rear electrode 302. The first sub-cell 310 is arranged such that the n-type semiconducting layer 312 is adjacent to the second sub-cell 320. The photovoltaic device 300 is then configured so as to be illuminated through an p-type semiconducting layer 313 of the first sub-cell 310. The photoactive region formed by the perovskite layer 311 is disposed between the p-type semiconducting layer 313 and the n-type semiconducting layer 312. The second sub-cell (bottom cell) 320 in FIG. 3 comprises a silicon heterojunction (SHJ) with a crystalline silicon layer 321 sandwiched between a first undoped amorphous silicon layer 322 and a second undoped amorphous silicon layer 324, which serve as passivation/buffer layers. Below the second undoped amorphous silicon layer 324, an n-type amorphous silicon (a-Si) layer 325 is formed adjacent to the rear electrode 302. A metal (e.g titanium) oxynitride layer 303 is provided between the first and the second sub-cells 310 and 320. In addition, a doped amorphous silicon layer 305 (i.e. p-doped) is provided between the second sub-cell 320 and the metal oxynitride layer 303 for protection of the first undoped amorphous silicon layer 322 (i.e. the a-Si(i) layer).

In general, it will be understood that the specific configurations of the first and second sub-cells are not particularly limited and each of them may comprise multiple sub-layers as well as one or more intermediate layers provided between the first and second sub-cell. In addition, it is noted that the monolithically integrated multi-junction photovoltaic device may include more than two sub-cells as long as the individual sub-cells are electrically connected in series between a single pair of terminals. Examples of triple sub-cell structures include, but are not limited to bifacial monolithically integrated multi-junction photovoltaic devices comprising a top sub-cell (second sub-cell) that comprises a photoactive region containing a perovskite material, a middle sub-cell (first sub-cell) comprising a silicon heterojunction (SHJ), and a bottom sub-cell that comprises a photoactive region containing a perovskite material.

Furthermore, those skilled in the art will appreciate that whilst the illustrated embodiments of the invention all relate to photovoltaic devices having a multi-junction structure in which the top perovskite sub-cell is illustrated as having a planar heterojunction arrangement, wherein the a compact layer of perovskite is provided between layers of p-type and n-type materials that do not have open porosity, the interconnect layers described herein are equally applicable to multi-junction photovoltaic devices in which the top perovskite sub-cell has other configurations. For example, the top perovskite sub-cell could comprise a porous scaffold of semiconducting or dielectric material on which the perovskite material is provided as either a thin layer or as a capping layer. By way of further example, the top perovskite sub-cell could comprise only one charge transporting region, as it has been shown that functional photovoltaic devices comprising a photoactive perovskite can be formed without any hole-transporting materials.

Manufacturing Methods

In a second embodiment, the present invention relates to a method of manufacturing a multi-junction photovoltaic device comprising a first sub-cell having a layer comprising a perovskite light absorber material and a second sub-cell, the method comprising the step of depositing a layer of metal (e.g. titanium) oxynitride between the first sub-cell and the second sub-cell. In preferred embodiments, the multi-junction photovoltaic device is a device described in conjunction with the first embodiment above.

More specifically, the method may comprise the steps of: providing a bottom sub-cell (i.e. second sub-cell) over a rear electrode; depositing a layer of metal (e.g. titanium) oxynitride over the bottom sub-cell; providing a top sub-cell (i.e. first sub-cell) having a layer comprising a perovskite light absorber material over the layer of metal (e.g. titanium) oxynitride, and providing a front electrode over the top sub-cell.

It will be appreciated that the steps of providing the first and the second sub-cell, and the front and rear electrodes are not particularly limited and may be suitably selected by the skilled artisan from various techniques depending on the nature of each of the (sub-) layers. Typical techniques include, but are not limited to solution deposition techniques (e.g., by screen printing, doctor blading, slot-dye-coating, spin coating etc.), sol-gel methods, vapor deposition (e.g physical vapor deposition (PVD), plasma-enhanced chemical vapor deposition (PECVD)), sputter deposition, pulsed-lased deposition, vacuum deposition, electroplating, or the like. However, in terms of simplicity and equipment costs, it may be preferred that PECVD methods are avoided to make full use of the advantages of the present invention.

In preferred embodiments of the present invention, the metal (e.g titanium) oxynitride layer is deposited by a physical vapor deposition (PVD) method, preferably by sputter deposition, especially preferably by magnetron sputtering, which does not require elaborate equipment and allows rapid deposition with consistent results.

In further preferred embodiments, a $TiO_xN_y$ layer may be deposited by using a magnetron sputtering system using a titanium nitride (TiN) target and $Ar/O_2$ mixture gas, which enables fine-tuning of the optical and electrical properties of the $TiO_xN_y$ thin film by simply varying the flow rate of oxygen. The sputtering power, frequency and base pressure is not particularly limited and may be suitably adjusted by the skilled artisan. An exemplary method of adjusting the magnetron sputtering conditions to provide $TiO_xN_y$ layers with suitable optical and electrical properties is disclosed in F. Chen et al., Optical Materials Express 2014, 4(9) 1833-1847.

By use of sputtering techniques, deposition rates of the titanium oxynitride layer of 0.4 nm/s or higher, such as 0.6 nm/s or higher, or 0.8 nm/s or higher may be achieved, each value referring to the average thickness of the titanium oxynitride layer. Accordingly, the intermediate layer may be deposited at a substantially higher rate compared to specialized PECVD techniques used in the art.

It will be understood that the preferred features of the first and second embodiments may be freely combined in any combination, except for combinations where at least some of the features are mutually exclusive.

Once given the above disclosure, many other features, modifications, and improvements will become apparent to the skilled artisan.

EXAMPLE

The invention is illustrated by the following Example.

Example 1

The solar-to-electricity power conversion efficiency (PCE) of perovskite/silicon tandem solar cells can be enhanced by placing an interlayer in between the two absorber layers, if the refractive index $n_{IL}$ of the material of such interlayer is in between those of the perovskite and the silicon material ($n_{PVSK} < n_{IL} < n_{Silicon}$). By doing so, such a layer can reduce the reflection of infrared light occurring at the interface region between the two absorbers. To maximize this beneficial effect, the interlayer should have a refractive index of about 2.7 at 800 nm wavelength ($n_{IL, 800} = 2.7$) and a thickness of about 100 nm. This way, the interference effect between light impinging on the upper and lower interface of the interlayer is utilized most efficiently. It has been demonstrated that doped nanocrystalline silicon oxide (nc-SiOx) can be used as such interlayer very efficiently, as it can be fabricated with the optoelectronic properties so as to leverage the optical effect and without deterioration of the electrical performance, by e.g. additional series resistance losses. However, the complicated fabrication method (PECVD) and relatively slow deposition rate of nc-SiOx has motivated a search for alternative materials that can be produced more easily. In accordance with the above described invention, perovskite/silicon tandem cells have been fabricated with a sputtered $TiO_xN_y$ interlayer. The results presently illustrate that the best films have a refractive index at 800 nm wavelength, $n_{800}$, of ~2.4 (the maximum refractive index achievable for $TiO_xN_y$ is $n_{800}$ of ~2.5). Due to the lower maximum refractive index, a slightly lower optical enhancement was expected compared to the nc-SiOx of the prior art.

Method

Figure 7:
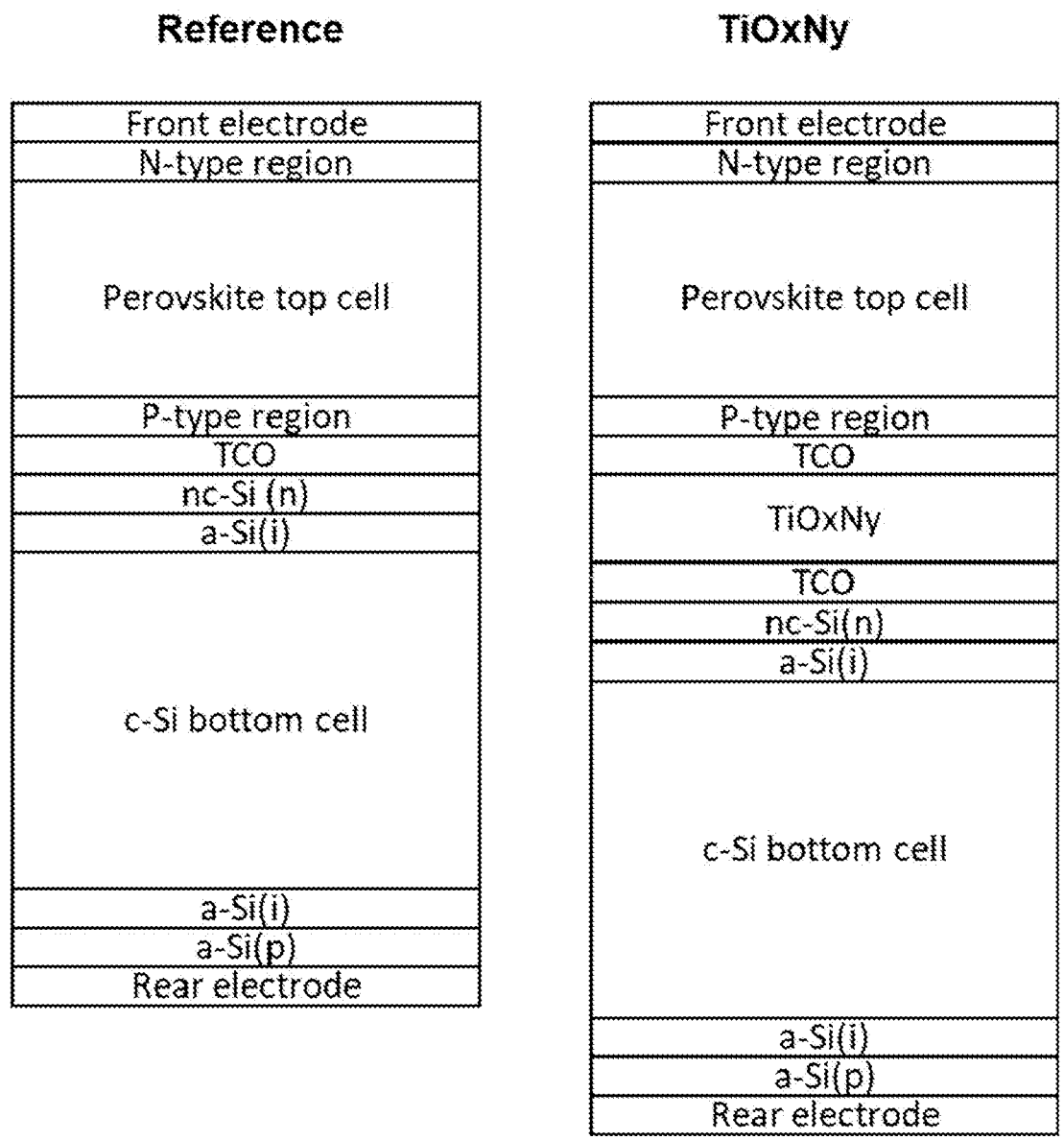
FIG. 7 illustrates an example of a multi-junction photovoltaic device cell stack with no interlayer split (left) and a $TiO_xN_y$ interlayer split (right).

A $TiO_xN_y$ layer with a thickness of 100 nm was deposited on top of a group of silicon heterojunction (SHJ) solar cells that were fabricated alongside a reference (control) group of SHJs without a specific optical interlayer. The SHJ cell fabrication and $TiO_xN_y$ depositions were executed according to the method in Chen et al. "Control of optical properties of $TiN_xO_y$ films and application for high performance solar selective absorbing coatings", Vol. 4, 9, 1833-1847, (2014). To avoid problems associated with electrical contact, the layer was sandwiched between TCO layers of 20 nm thickness. The device stacks are shown in FIG. 7. The additional TCO layers have relatively little influence optically due to their low thickness.

Figure 8:
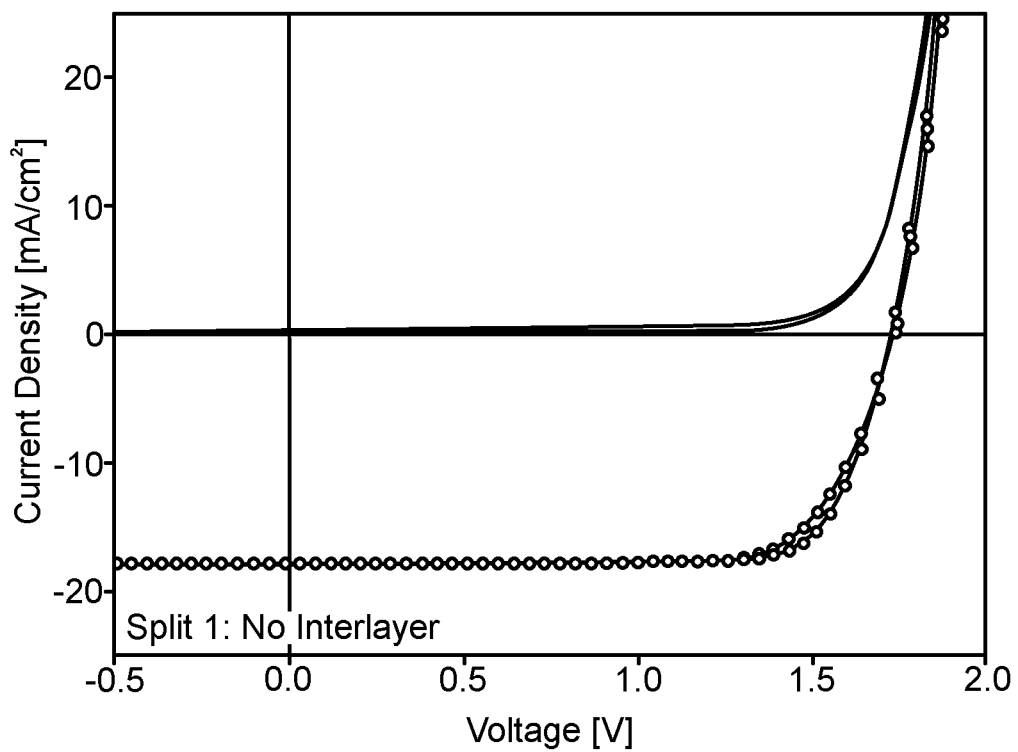
FIG. 8 illustrates the current density, $J_{SC}$ against voltage characteristics of the splits without an interlayer, split 1 (top), and with a $TiO_xN_y$ interlayer, split 2 (bottom).
Figure 8:
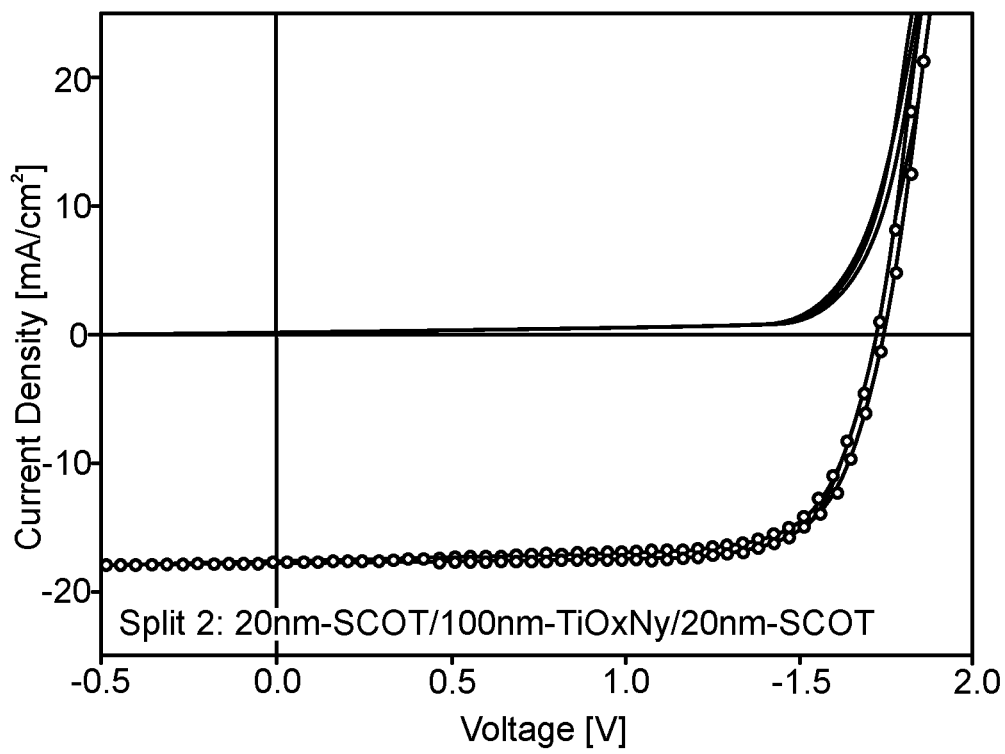
Figure 9:
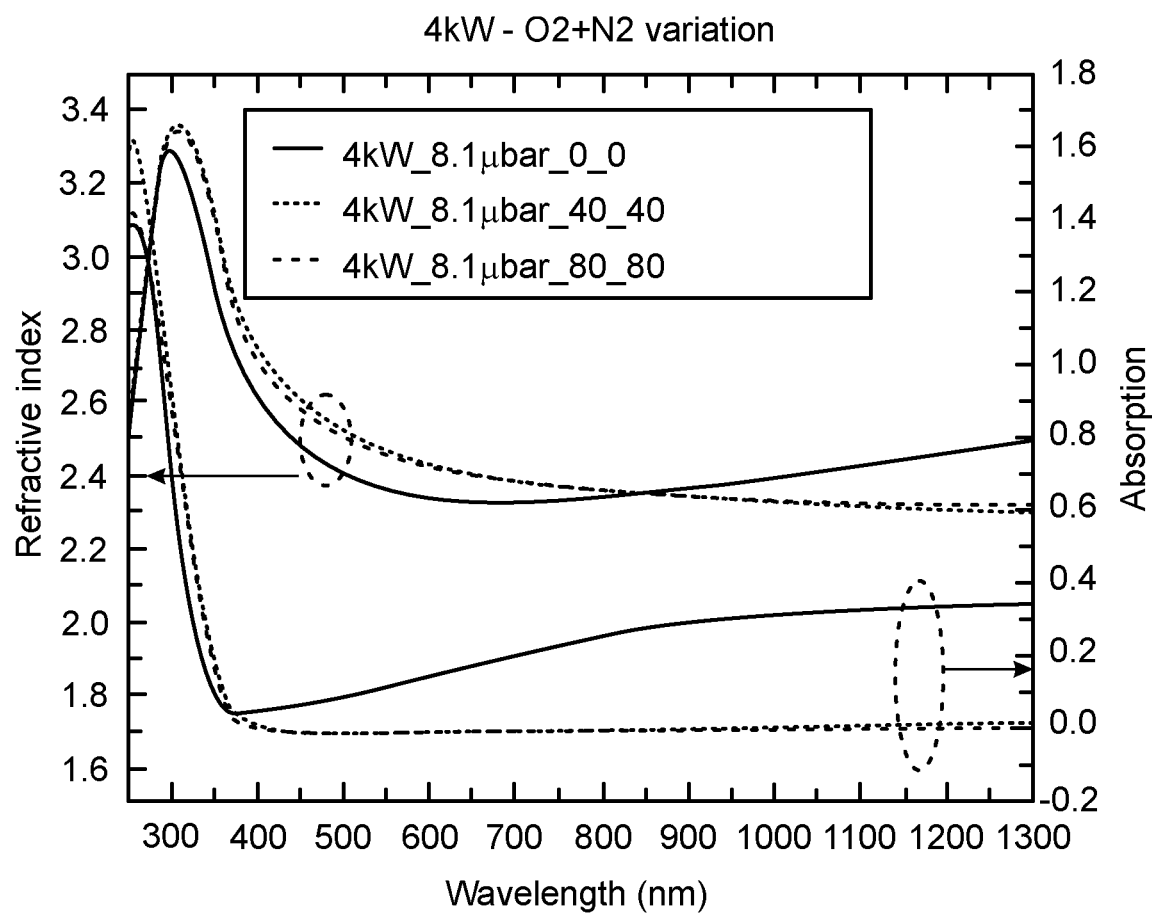
FIG. 9 illustrates a graph of refractive index (including the absorption or extinction coefficient, "nk") against wavelength measured by spectral ellipsometry to demonstrate the optical properties of a series of $TiO_xN_y$ films deposited with varying gas flows of 0 standard cubic centimeters (sccm), 40 sccm and 80 sccm.
Figure 10:
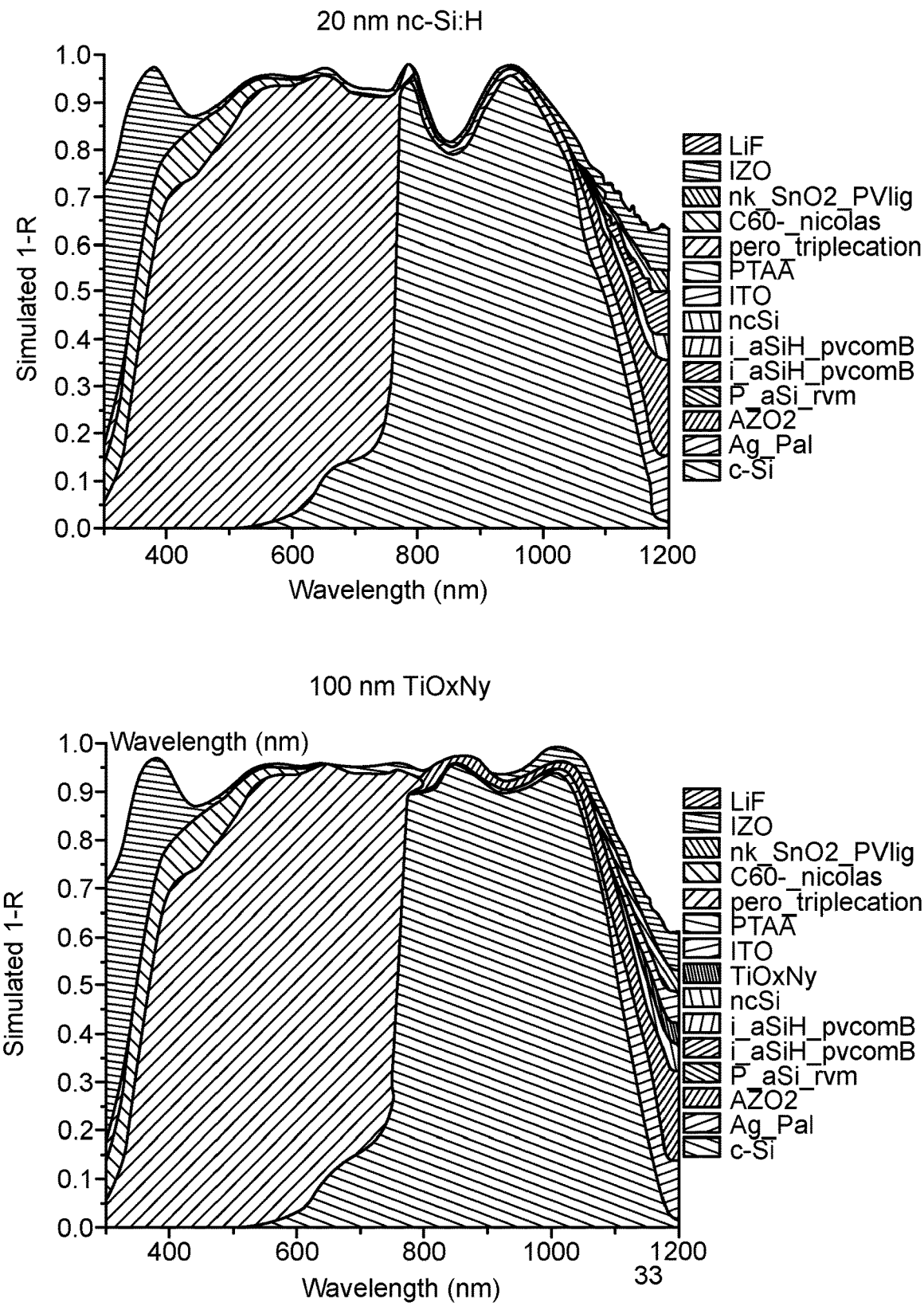
FIG. 10 illustrates the results of the optical simulations of the no interlayer split (top) and $TiO_xN_y$ interlayer split (bottom), wherein the absorption for each simulated EQE of the layers in the simulated stack are displayed. The legend on the right-hand side of the spectra correspond to the tandem cell layering and its respective components.
Figure 11:
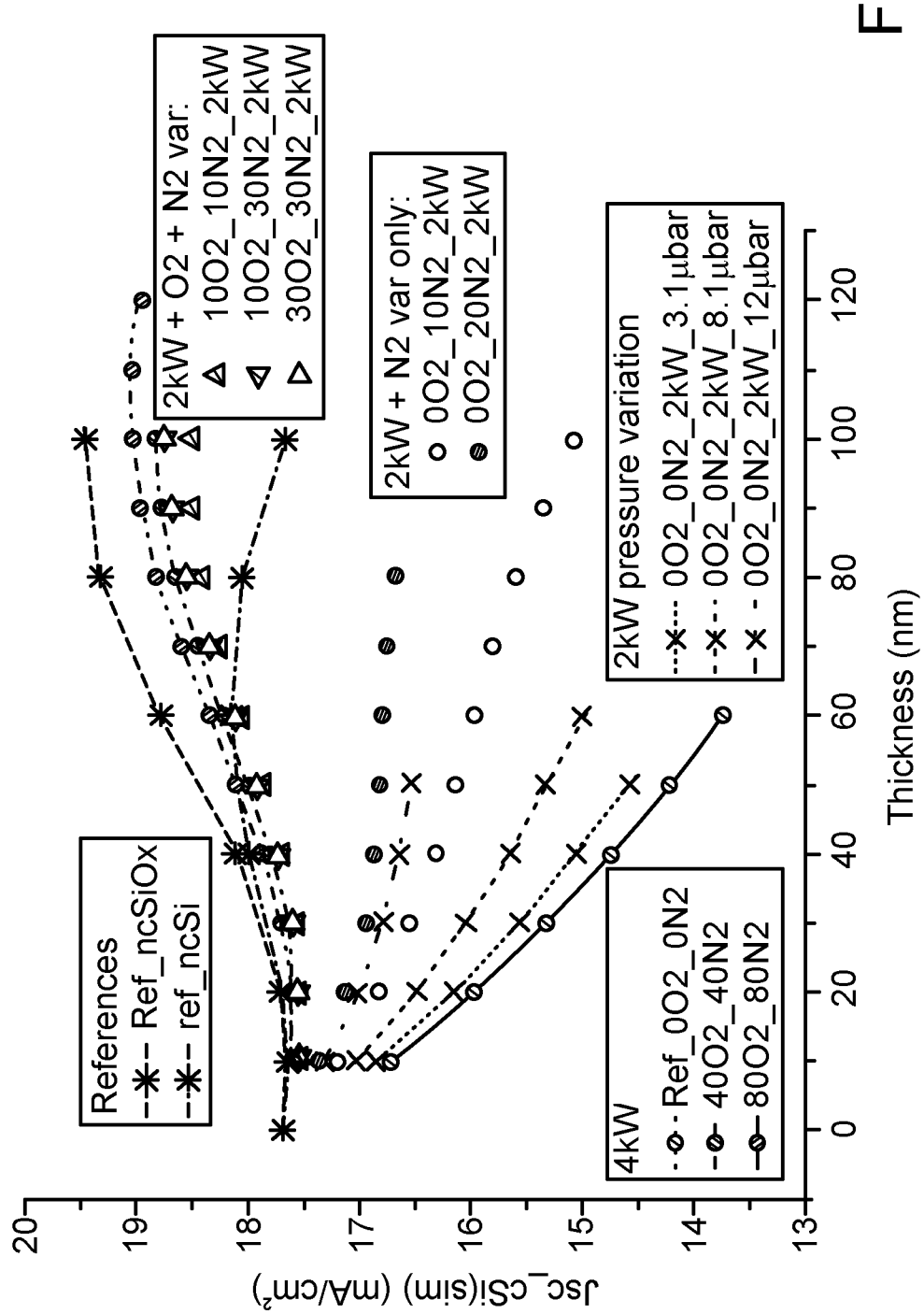
FIG. 11 illustrates the simulated $J_{SC}$ values of the bottom sub-cell for various $TiO_xN_y$ interlayers, a nc-Si reference (baseline) and a nc-$SiO_x$ reference.

The perovskite top cell was deposited according to the state of the art method described in Al-Ashouri et al., "Monolithic perovskite/silicon tandem solar cell with >29% efficiency by enhanced hole extraction", Vol. 370, 6522, 1300-1309, (2020). The tandem cells were then characterized by current-voltage (IV) measurements under illumination, whereby care was taken to simulate the AM1.5G Norm solar spectrum appropriately (representative IV measurements are shown in FIG. 8). Furthermore, external quantum efficiency measurements were performed with bias lights to measure each sub cell independently. Optical simulations were performed. The optical properties of the films were measured by spectral ellipsometry (an example of the extracted refractive index and absorption or extinction coefficient, "nk", is shown in FIG. 9). Optical simulations were performed using the transfer matrix method. The results of the optical simulations are shown in the supporting information (see FIGS. 10 and 11).

Results and Discussion

Figure 4:
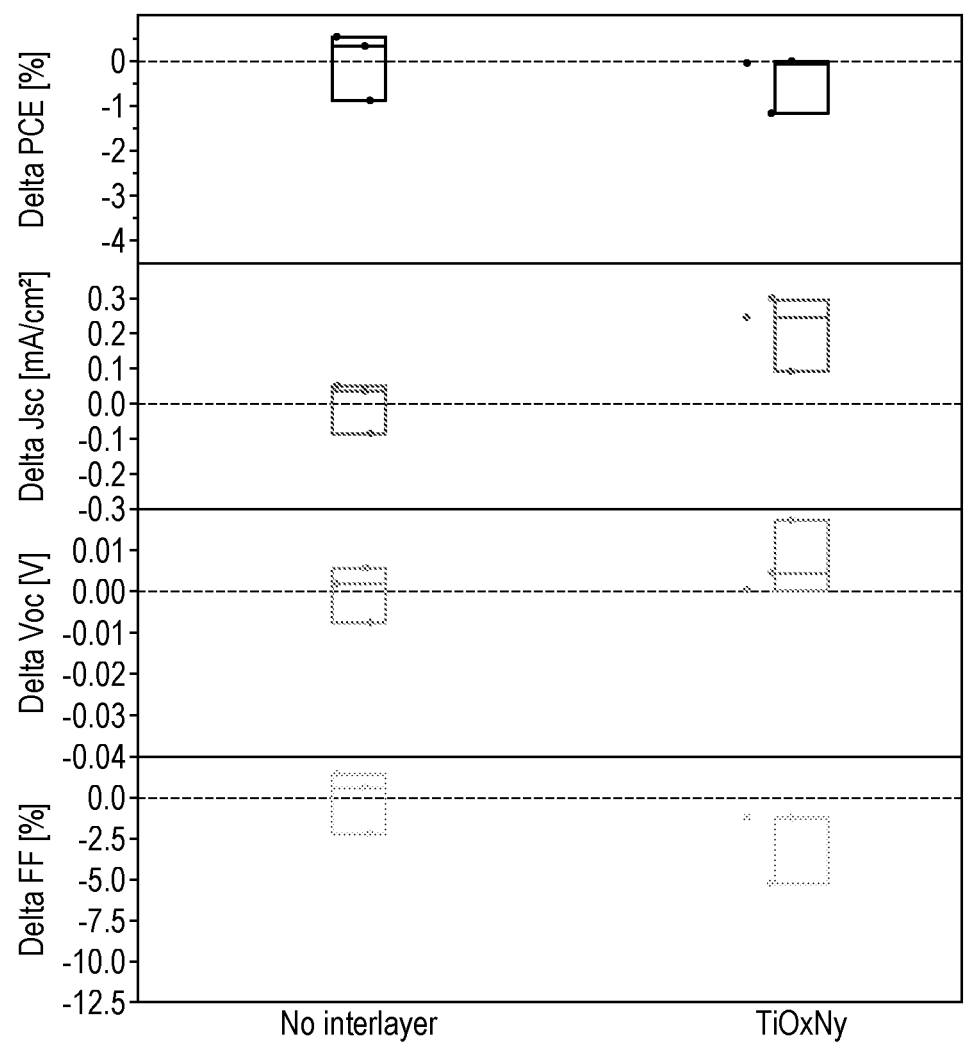
FIG. 4 illustrates the power conversion efficiency (PCE), short-circuit current density ($J_{SC}$), open circuit voltage ($V_{OC}$) and fill factor (FF) for six tandem cells, three with no interlayer split and three with a $TiO_xN_y$ interlayer split. Results were normalized to the average value of the no interlayer split for each of the four above listed parameters.

FIG. 4 shows the change (delta) in the IV characteristics: power conversion efficiency (PCE), short-circuit current density (Jsc), open circuit voltage (Voc) and fill factor (FF) for a total of six tandem cells, three from the "no interlayer split" and three from the "$TiO_xN_y$ split". The results were normalized to the average value of the "no interlayer split" for each of the four parameters to illustrate the differences.

Also shown are the box plots for each distribution in FIG. 4. PCE is slightly lower on average for the $TiO_xN_y$ split—the reason for this is a change in average FF. On the other hand, it can be observed that the average of the Jsc is increased. The delta Jsc of +0.2-+0.3 mA/cm² is considerably lower than in another nc-SiOx reference, namely Mazzarella et al. "Infrared Light Management Using a Nanocrystalline Silicon Oxide Interlayer in Monolithic Perovskite/Silicon Heterojunction Tandem Solar Cells with Efficiency above 25%", Advanced Energy Materials, Vol. 9, 14, (2019) where gains of +1.8 mA/cm² can be observed (compare also FIG. 11). In addition, the average Voc is slightly increased.

Figure 5:
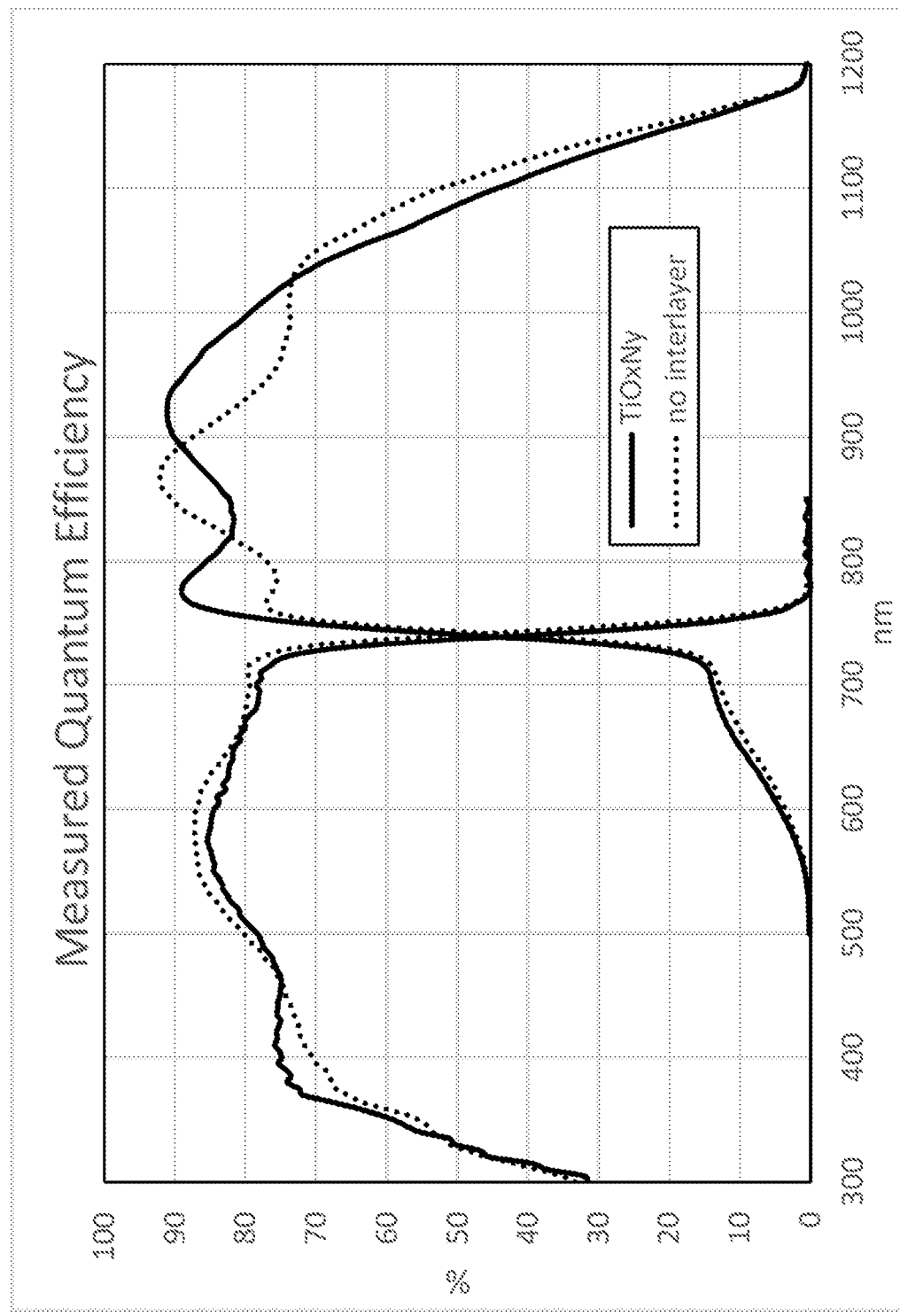
FIG. 5 illustrates the measured external quantum efficiency (EQE) versus wavelength (in nm) from two representative tandem cells, one from no interlayer split and another from the $TiO_xN_y$ interlayer split. The perovskite top cell absorbs in the 300-780 nm range, while the silicon bottom cell absorbs from 500-1200 nm.

FIG. 5 shows the measured quantum efficiency of two representative cells from each split. It can be seen that interference effects are visible in the EQE of the silicon bottom cell. It has been shown that such interference effects are caused by light that is reflected at the interface region (Mazzarella et al. Advanced Energy Materials, Vol. 9, Issue 14, 11 Apr. 2019). Furthermore, it can be seen that the amplitude of the interference fringes is reduced in the EQE of the cell that has the interlayer. Comparing this experimentally observed EQE curve to the simulated EQE (FIG. 10), one observes similar behaviour, wherein the amplitude of the interference fringes is reduced. Although the location of the maxima and minima of the interference fringes are not exactly in the same position, this is likely due to a slightly different perovskite absorber thickness in the experiment versus the simulation.

Figure 6:
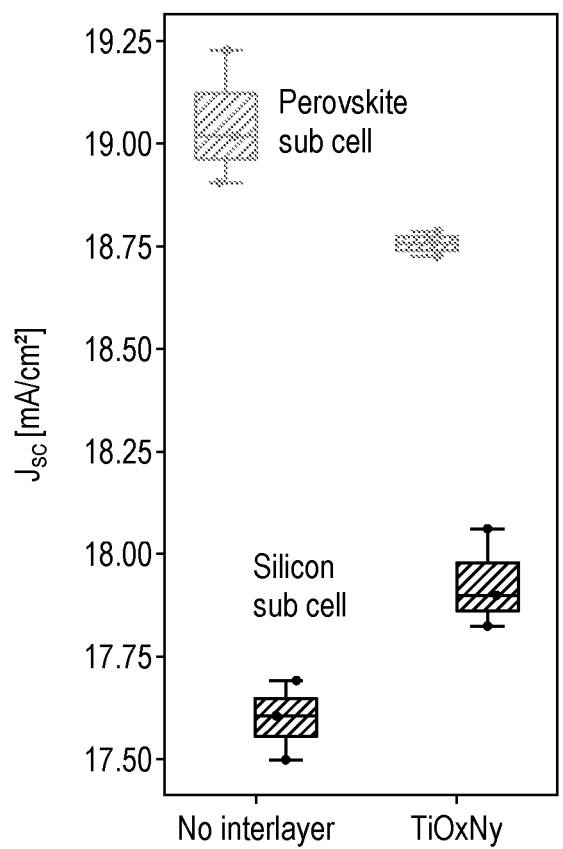
FIG. 6 illustrates a box-plot of the $J_{SC}$ for the perovskite and silicon sub-cells calculated from the EQE curves in FIG. 5 for no interlayer and a $TiO_xN_y$ interlayer.

FIG. 6 shows the Jsc values of the perovskite- and silicon-sub cells as calculated from the EQE curves and the AM1.5G Norm solar spectrum for the three cells with no interlayer and the three cells with the $TiO_xN_y$ interlayer, respectively. It can be seen that the bottom cell profits by around 0.3 mA/cm² from the $TiO_xN_y$ interlayer. This gain is not as high as theoretically predicted (compare FIG. 11). This could be because the refractive index on the cell is somewhat different compared to the one measured on glass substrates. Alternatively, the additional contact layers that were omitted from the simulations may have a larger influence than initially expected.

Furthermore, it can be seen in FIG. 6 that in all cases, the Jsc values of the perovskite sub cells are larger than those of the silicon sub cell. Since the Jsc of the tandem device is limited by the Jsc of the cell with the lower current density (due to the monolithic series connection), the gain in Jsc visible in FIG. 4 can be explained by the increase of Jsc in the limiting sub cell. Hence, we can deduce that EQE and IV measurements are in good agreement. Somewhat surprising is the reduction in the Jsc of the perovskite sub cell. A small change can be expected based on the simulations, since less light is reflected back into the top cell. However, the magnitude of this change should be much smaller than the gain in the silicon bottom sub cell. Since the variation in the "no interlayer" perovskite sub cell Jsc group is the largest of the four Jsc groups, this unexpectedly large drop might be caused by something unrelated to the experiment, such as a measurement error or process variation in one of the top cell processes. The difference in the top cell EQE at around 400 nm wavelength visible in FIG. 5 supports this hypothesis as it cannot be seen in the theoretical prediction (compare FIG. 10): Light of 400 nm wavelength should not "see" the interlayer but should be absorbed entirely by the top cell.

CONCLUSION

It is concluded that the above results on tandem cells confirm the theoretical predictions, that with a $TiO_xN_y$ interlayer the reflection losses of perovskite/silicon tandem cells occurring in the infrared range of the spectrum can be reduced by the equivalent of 0.3 mA/cm².

REFERENCE NUMERALS

100/200/300: monolithic multijunction photovoltaic device
110/210/310: first sub-cell
120/220/320: second sub-cell
101/201/301: front electrode
102/202/302: rear electrode
103/203/303: metal (e.g titanium) oxynitride layer
204: light transmissive electrically conductive oxide layer 205: doped amorphous silicon layer (n-type)
305: doped amorphous silicon layer (p-type)
211: perovskite layer
212/312: n-type semiconducting layer
213/313: p-type semiconducting layer
221/321: crystalline silicon layer
222/322: first undoped amorphous silicon layer
224/324: second undoped amorphous silicon layer
225: doped amorphous silicon layer (p-type)
325: doped amorphous silicon layer (n-type)

The invention claimed is:

1. A multi-junction photovoltaic device comprising a first sub-cell and a second sub-cell, the first sub-cell having a layer comprising a perovskite light absorber material, wherein a layer of metal oxynitride is provided between the first sub-cell and the second sub-cell, wherein the metal in the metal oxynitride layer is an early transition metal selected from: Ti, W, Mo, Hf, Ta, Nb, Zr, Cr and V.

2. The multi-junction photovoltaic device according to claim 1, which has a monolithically integrated structure.

3. The multi-junction photovoltaic device according to claim 2, wherein the device has a tandem structure.

4. The multi-junction photovoltaic device according to claim 1, in which the first sub-cell also comprises an n-type semiconducting layer and a p-type semiconducting layer on either side of the layer comprising a perovskite light absorber material.

5. The multi-junction photovoltaic device according to claim 4, in which the layer of oxynitride is adjacent and in contact with either the n-type or p-type semiconducting layer.

6. The multi-junction photovoltaic device according to claim 4, in which one of the n-type or p-type semiconducting layers is adjacent and in contact with a major surface of a layer of a light transmissive electrically conductive oxide layer, and the opposing major surface of the layer of a light transmissive electrically conductive oxide layer is adjacent and in contact with the layer of metal oxynitride.

7. The multi-junction photovoltaic device according to claim 1, in which the second sub cell comprises a layer of crystalline silicon light absorber material.

8. The multi-junction photovoltaic device according to claim 7, in which the second sub-cell comprises a heterojunction photovoltaic device.

9. The multi-junction photovoltaic device according to claim 8, in which the second sub-cell comprises a layer of crystalline silicon sandwiched between two layers of undoped amorphous silicon.

10. The multi-junction photovoltaic device according to claim 9, in which a layer comprising doped amorphous silicon is provided between the second sub-cell and the layer of metal oxynitride.

11. The multi-junction photovoltaic device according to claim 9, in which a layer comprising doped nanocrystalline silicon oxide is provided between the second sub-cell and the layer of metal oxynitride.

12. The multi-junction photovoltaic device according to claim 1, comprising, in the following order:
 a) a front electrode;
 b) the first sub-cell having a layer comprising a perovskite light absorber and comprising a sub-cell comprising an n-type semiconducting layer on one surface of the layer comprising a perovskite light absorber and a p-type semiconducting layer on the other surface of the layer comprising a perovskite light absorber;
 c) an optional light transmissive electrically conductive oxide layer;
 d) the layer of metal oxynitride;
 e) a doped amorphous silicon layer;
 f) the second sub-cell, comprising a layer of crystalline silicon light absorber material between a first and a second undoped amorphous silicon layer; and
 g) a rear electrode.

13. The multi-junction photovoltaic device according to claim 12,
 wherein the p-type semiconducting layer of the first sub-cell is adjacent to the layer of metal oxynitride or to the optional light transmissive electrically conductive oxide layer;
 wherein the doped amorphous silicon layer is an n-type amorphous silicon layer; and
 wherein the second sub-cell further comprises a p-type amorphous silicon layer adjacent to the rear electrode.

14. The multi-junction photovoltaic device according to claim 1, in which the layer of metal oxynitride is adapted to have a refractive index of between 2.3 and 3.7.

15. The multi-junction photovoltaic device according to claim 14, wherein the layer of metal oxynitride is a titanium oxynitride having a refractive index of between 2.3 and 3.7 or between 2.3 and 2.9.

16. The multi-junction photovoltaic device according to claim 1, wherein the layer of metal oxynitride has a thickness of between 20 nm and 200 nm.

17. A method of manufacturing a multi-junction photovoltaic device comprising a first sub-cell having a layer comprising a perovskite light absorber material and a second sub-cell, the method comprising the step of depositing a layer of a metal oxynitride between the first sub-cell and the second sub-cell, wherein the metal in the metal oxynitride layer is an early transition metal selected from: Ti, W, Mo, Hf, Ta, Nb, Zr, Cr and V.

18. The method of manufacturing a multi-junction photovoltaic device according to claim 17, wherein the metal oxynitride layer is deposited by a physical vapor deposition method; and/or wherein the deposition rate of the metal oxynitride layer is 0.4 nm/s or higher.

* * * * *